United States Patent
Huynh et al.

(10) Patent No.: US 8,106,701 B1
(45) Date of Patent: Jan. 31, 2012

(54) LEVEL SHIFTER WITH SHOOT-THROUGH CURRENT ISOLATION

(75) Inventors: Jonathan Hoang Huynh, San Jose, CA (US); Feng Pan, Fremont, CA (US); Qui Vi Nguyen, San Jose, CA (US); Trung Pham, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 12/895,457

(22) Filed: Sep. 30, 2010

(51) Int. Cl.
 H03L 5/00 (2006.01)
(52) U.S. Cl. .............................. 327/333; 326/62; 326/81
(58) Field of Classification Search .............. 326/62–63, 326/80–82; 327/306, 333
 See application file for complete search history.

(56) References Cited

U.S. PATENT DOCUMENTS

| | | | |
|---|---|---|---|
| 4,580,067 | A | 4/1986 | Proebsting |
| 4,678,941 | A | 7/1987 | Chao et al. |
| 4,954,731 | A | 9/1990 | Dhong et al. |
| 5,436,587 | A | 7/1995 | Cernea |
| 5,512,845 | A | 4/1996 | Yuh |
| 5,570,315 | A | 10/1996 | Tanaka et al. |
| 5,723,985 | A | 3/1998 | Van Tran et al. |
| 5,790,453 | A | 8/1998 | Chevallier |
| 5,903,495 | A | 5/1999 | Takeuchi et al. |
| 5,912,838 | A | 6/1999 | Chevallier |
| 5,940,333 | A | 8/1999 | Chung |
| 6,044,012 | A | 3/2000 | Rao et al. |
| 6,046,935 | A | 4/2000 | Takeuchi et al. |
| 6,078,518 | A | 6/2000 | Chevallier |
| 6,166,982 | A | 12/2000 | Murray et al. |

(Continued)

FOREIGN PATENT DOCUMENTS

JP 02 034022 A 2/1990
(Continued)

OTHER PUBLICATIONS

U.S. Appl. No. 12/973,493, filed Dec. 20, 2010, 28 pages.
(Continued)

*Primary Examiner* — Dinh T. Le
(74) *Attorney, Agent, or Firm* — Davis Wright Tremain LLP

(57) ABSTRACT

A level shifter circuit suitable for high voltage applications with shoot-through current isolation is presented. The level shifter receives a first enable signal and receives an input voltage at a first node and supplies an output voltage at a second node. The circuit provides the output voltage from the input voltage in response to the first enable signal being asserted and sets the output node to a low voltage value when the first enable signal is de-asserted. The level shifting circuit includes a depletion type NMOS transistor, having a gate connected to the output node, and a PMOS transistor, having a gate connected to the first enable signal. It also includes a first resistive element that is distinct from the NMOS and PMOS transistors. The NMOS transistor, the PMOS transistor and the first resistive elements are connected in series between the first and second nodes, with the NMOS transistor being connected to the first node. The level shifter further includes a discharge circuit connected to the second node and to receive a second enable signal. The second enable signal is asserted when the first enable signal is de-asserted and is asserted when the first enable signal is de-asserted, and the discharge circuit connects the second node to the low voltage value when the second enable signal is asserted and isolates the second node from ground when the second enable signal is de-asserted.

18 Claims, 4 Drawing Sheets

U.S. PATENT DOCUMENTS

| | | |
|---|---|---|
| 6,169,432 B1 | 1/2001 | Sharpe-Geisler |
| 6,370,075 B1 | 4/2002 | Haeberli et al. |
| 6,556,465 B2 | 4/2003 | Haeberli et al. |
| 6,696,880 B2 | 2/2004 | Pan et al. |
| 6,717,851 B2 | 4/2004 | Mangan et al. |
| 6,760,262 B2 | 7/2004 | Haeberli et al. |
| 6,922,096 B2 | 7/2005 | Cernea |
| 7,030,683 B2 | 4/2006 | Pan et al. |
| 7,053,689 B2 * | 5/2006 | Kim ............... 327/390 |
| 7,135,910 B2 | 11/2006 | Cernea |
| 7,368,979 B2 | 5/2008 | Govindu et al. |
| 7,492,206 B2 * | 2/2009 | Park et al. ............. 327/333 |
| 7,554,311 B2 | 6/2009 | Pan |
| 7,592,858 B1 * | 9/2009 | Jung ............... 327/536 |
| 7,795,952 B2 | 9/2010 | Lui et al. |
| 2007/0126494 A1 | 6/2007 | Pan |
| 2007/0139077 A1 | 6/2007 | Park et al. |
| 2007/0139099 A1 | 6/2007 | Pan |
| 2007/0268748 A1 | 11/2007 | Lee et al. |
| 2008/0198667 A1 | 8/2008 | Hosomura et al. |
| 2009/0058506 A1 | 3/2009 | Nandi et al. |
| 2009/0058507 A1 | 3/2009 | Nandi et al. |
| 2009/0153230 A1 | 6/2009 | Pan et al. |
| 2009/0153232 A1 | 6/2009 | Fort et al. |
| 2009/0302930 A1 | 12/2009 | Pan et al. |
| 2009/0315616 A1 | 12/2009 | Nguyen et al. |
| 2009/0322413 A1 | 12/2009 | Huynh et al. |
| 2010/0019832 A1 | 1/2010 | Pan |
| 2010/0067300 A1 | 3/2010 | Nakamura |
| 2010/0309720 A1 | 12/2010 | Lui et al. |
| 2011/0018615 A1 | 1/2011 | Pan |

FOREIGN PATENT DOCUMENTS

| | | |
|---|---|---|
| JP | 3-41694 | 2/1991 |
| JP | 9-139079 | 3/1997 |
| JP | 11-126478 | 5/1999 |

OTHER PUBLICATIONS

U.S. Appl. No. 12/973,641, filed Dec. 20, 2010, 26 pages.

U.S. Appl. No. 12/833,167, filed Jul. 9, 2010, 55 pages.

Feng Pan., "Charge Pump Circuit Design," McGraw-Hill, 2006, 26 pages.

Pylarinos et al., "Charge Pumps: An Overview," Department of Electrical and Computer Engineering, University of Toronto, www.eecg.toronto,edu/~kphang/ece1371/chargepumps.pdf.

Notification of Transmittal of the International Search Report and the Written Opinion of the International Searching Authority, or the Declaration for International Application No. PCT/US2001/049109 mailed Nov. 21, 2011, 10 pages.

* cited by examiner

LEVEL SHIFTER WITH SHOOT-THROUGH CURRENT ISOLATION

BACKGROUND

1. Field of the Invention

This application relates generally to integrated circuit semiconductor devices, and, more specifically, to high voltage switches.

2. Background Information

In an integrated circuit, it is common to need a circuit to provide a voltage from a source to an output in response to an input signal. An example is a word line select circuit of in a non-volatile memory. In such a circuit, a relatively high programming voltage is supplied to a word line in response to an input signal at the device to device logic level. For example, in fairly typical values for a NAND type FLASH memory, 10-30V is provided on a word line in response to an input going from ground to "high" value of 3-5V. Such level shifters that are capable of handling such high voltages find use in multiple places in the peripheral circuitry of programmable non-volatile memories. To improve the operation of the circuit, it is important that the voltage on the output reaches its full value quickly when enabled and also that level shifter turns off quickly when disabled.

Many designs exist for such switches. A number of common designs use an NMOS transistors and a local charge pump to raise the gate voltage values used to turn on the transistor and pass the high voltage from the source to the output. Due to the body bias of the NMOS transistors and charge pump ramping speed, these switches generally take a relatively long time to reach the passing voltage level need to pass the full high voltage. These problems are aggravated by both higher programming voltage level needed and lower device supply voltages as these combine to make it harder to pump efficiently and timely due to body effects of NMOS transistors in the charge pump. Consequently, there is an ongoing need for level shifter circuits capable of handling high voltages and having a quick response when enabled and disabled.

SUMMARY OF THE INVENTION

According to a general set of aspects, a level shifter circuit is presented. The level shifter is connected to receive an input voltage at a first node, to receive a first enable signal, and to supply an output voltage at a second node. The output voltage is provided from the input voltage in response to the first enable signal being asserted and to a low voltage value when the first enable signal is de-asserted. The level shifting circuit includes a depletion type NMOS transistor, having a gate connected to the second node, and a PMOS transistor, having a gate connected to the first enable signal. It also includes a first resistive element that is distinct from the NMOS and PMOS transistors. The NMOS transistor, the PMOS transistor and the first resistive elements are connected in series between the first and second nodes, with the NMOS transistor being connected to the first node. The level shifter further includes a discharge circuit connected to the second node and to receive a second enable signal. The second enable signal is asserted when the first enable signal is de-asserted and is asserted when the first enable signal is de-asserted, and the discharge circuit connects the second node to the low voltage value when the second enable signal is asserted and isolates the second node from ground when the second enable signal is de-asserted.

In further aspects, a level shifter circuit connected between an input node and an output node and includes a first current path and a second current path. The first current path is between the input node and the output node and is connected to receive a first enable signal. The first current path includes a depletion type NMOS transistor, connected to the input node and having a gate connected to the output node, and a PMOS transistor that is connected in series with the depletion type NMOS transistor between the input and output nodes. The PMOS transistor has a gate connected to receive the first enable signal, whereby the PMOS transistor is turned on when the first enable signal is asserted. The second current path is between the output node and ground is connected to receive a second enable signal, whereby the output node is connected to ground when the second enable signal is asserted. The level shifter circuit is enabled when the first enable circuit is asserted and the second enable signal is not asserted, and the level shifter circuit is disabled when the second enable circuit is asserted and the first enable signal is not asserted. The first current path also includes one or more resistive elements, distinct from the depletion type NMOS and PMOS transistors, connected in series with the PMOS transistor between the depletion type NMOS transistor and the output node.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Level shifters find many applications in integrated circuits when there is a need to provide a particular voltage at a given node in response to an enable signal. For example, they frequently occur as part of the peripheral circuitry on non-volatile memory devices where they may need to supply some of the fairly high voltage levels, such as in the 10-30 volt range, used in such devices. Examples of such non-volatile memory devices are described in U.S. Pat. Nos. 5,570,315, 5,903,495, and 6,046,935, for example, a specific example of a switch where such a level shifter can be used is presented in the US patent application entitled "High Voltage Switch Suitable for use in Flash Memory" of Jonathan Hoang Huynh and Feng Pan, filed concurrently with the present application. It is typically important that such a level shifter circuit respond quickly to the enable signal, both for turning on and turning off.

The situation can be briefly illustrated with reference to FIG. 1. The idea is to be able to supply the input voltage (TG_IN at node X) to the circuit's output (TG_OUT at node Y) in response to an enable signal (EN). Here, the output is being supplied to the pass gate 121. When enabled, the current I1 is used to charge up node Y. When disabled, a current Idis is used to take the node Y to ground.

Figure 1:
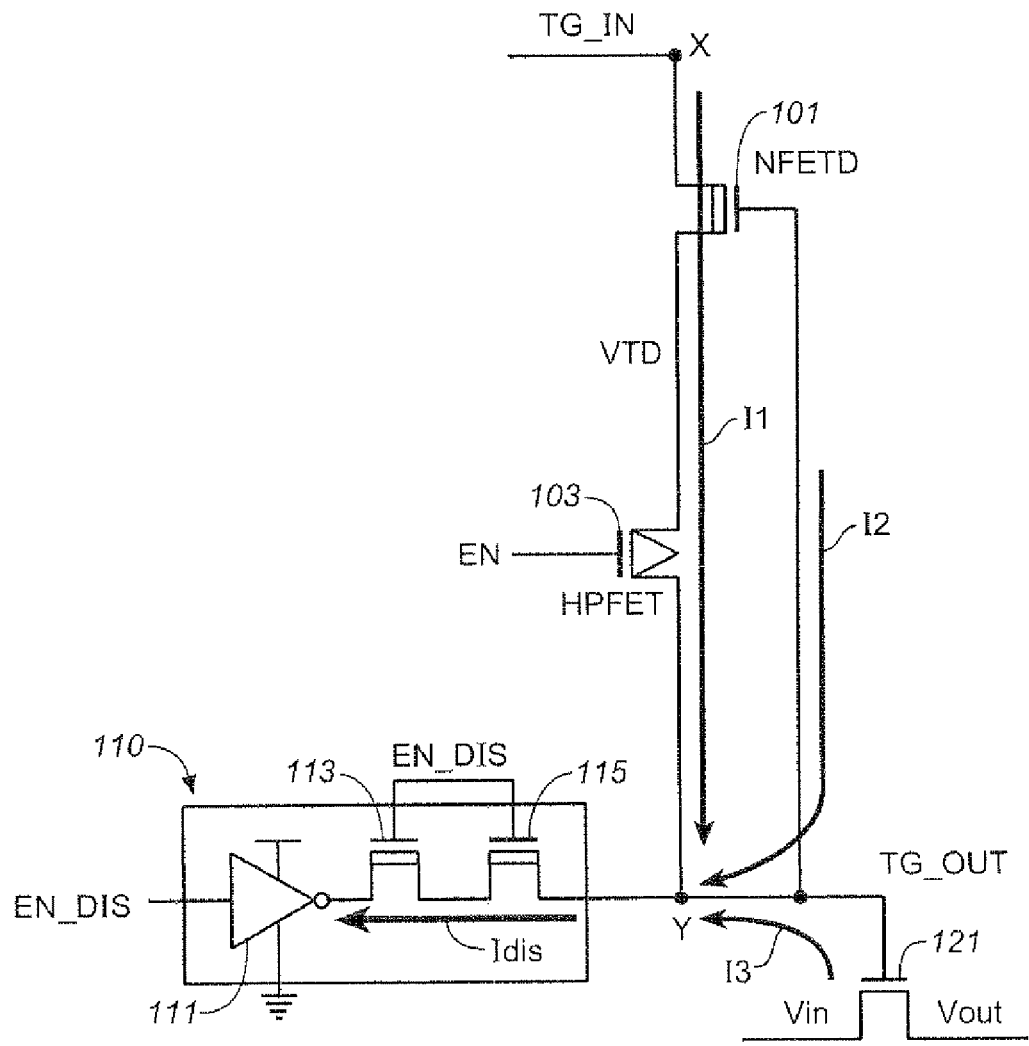
FIG. 1 is a circuit diagram of a level shifter.

In the example of FIG. 1, the level-shifter uses a depletion 101 device and p-channel device 103 as a switch to pass a high voltage from input (TG_IN) to output (TG_OUT) without the need of using a charge pump. During the reset, when input is still high and the output is being discharged to ground, shoot-through current, with a corresponding power loss, occurs as the current I1 continues to try to charge up the node Y while the current Idis tries to take it to ground. The duration of the current will depend on the input voltage level. In order to reduce the amount of this shoot-through current, exemplary embodiments of a level shifter circuit add a resistance in the charging path, creating an isolation during the discharge phase to minimize the input power lost.

Considering FIG. 1 further, this shows one design that overcomes many of the problems described in the Background section. In response to an enable signal EN, the level shifter supplies a voltage TG_OUT derived from the input voltage source TG_IN to, in this case, the gate of a transistor 121, allowing it to pass the voltage Vin to Vout. The switch supplies the input voltage TG_IN from node X to the output node Y through a depletion type NMOS transistor NFETD 101 and PMOS transistor HPFET 103 connected in series. The gate of HPFET 103 is connected to the enable signal EN and the gate of NFETD is connected to receive the voltage level TG_OUT. A discharge circuit 110 is also connected to the node Y to discharge this node when the level shifted is disabled. The discharge block 110 receives, in this embodiment, a second, discharge enable signal EN_DIS, whose relation to the first enable signal. EN will be described below.

Since the voltage level TG_IN at node X may have a values of 10-30 volts in the case of a NAND memory structure, the devices NFETD 101 and HPFET 103 may need be high voltage devices formed to handle the voltages expected in the particular application. In the exemplary embodiments present here, the low voltage level on the circuit, Vss, will be taken as ground and the high value Vdd is typically 1.8 to 2.2V.

Figure 2:
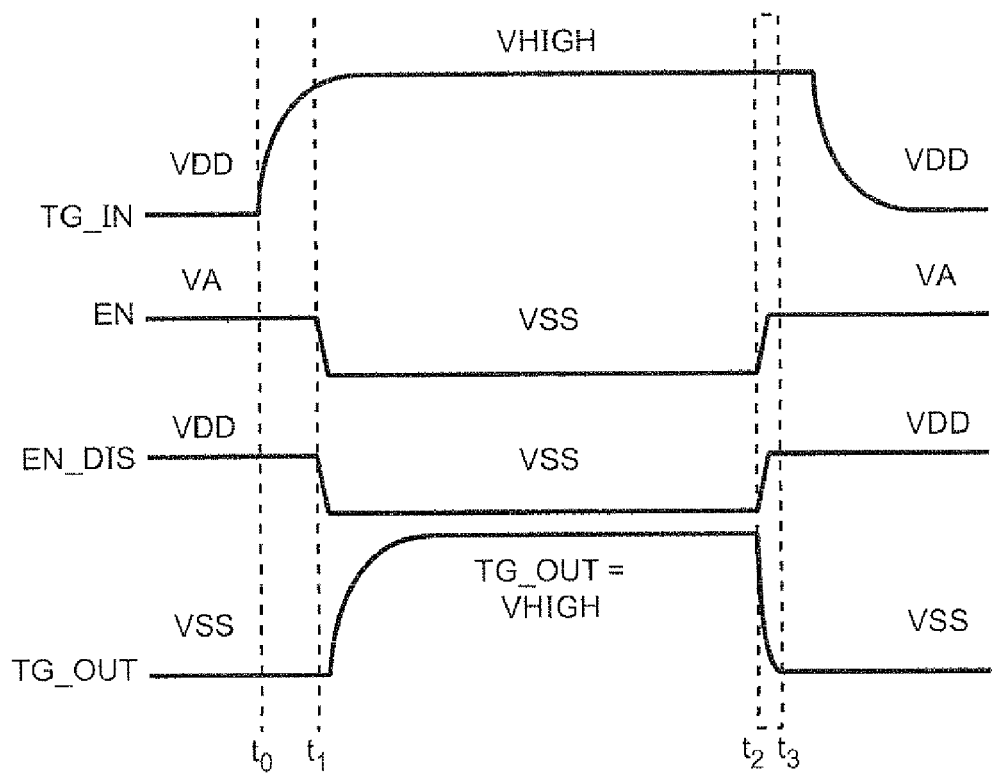
FIG. 2 is a set of waveforms illustrating the operation of the circuit of FIG. 1.

The function of the level shifter circuit of FIG. 1 can be described with reference to the waveforms of FIG. 2. Initially, the circuit is disabled, with EN de-asserted and EN_DIS asserted. As arranged here, the EN_DIS signal is at Vdd when asserted and at Vss when de-asserted. The EN signal is at the low value (Vss) when asserted and at a value VA. The value of VA is chosen to be sufficient to effectively turn off HPFET 103. As can be seen from FIG. 2 (and similarly for FIG. 5, discussed below), EN and EN_DIS are both high and both low at the same time, differing only in their amplitude. To some extent, they can be considered the same enable signal (or, depending on definitions, inverses of each other), but the EN signal may differ in its high value (as here) due to the need for it to effectively turn off the p-type device HPFET 103. As will be understood, the definition of when each of EN and EN_DIS is high or low, and when they are considered asserted or de-asserted can be reversed as these signals can just as easily be defined in terms of their inverted versions. For this discussion, the EN signal can be considered to control when the level shifter is enabled to pass the input voltage from the node X to the output node Y and the EN_DIS signal can be considered to control when the discharge block 110 (or 210 in FIG. 4, discussed below) is enabled to discharge the node Y to Vss.

Returning to FIG. 2, initially the input voltage TG_IN is at Vdd, EN is at VA, and EN_DIS is at Vdd. Consequently, the node Y is connected to Vss through the block 110 and the output level TG_OUT is also at Vss. As EN is at VA, HPFET 103 is turned off, so that even though NFETD 101 is a depletion type device whose gate is at Vss, the current I1 is zero.

To enable the level shifter, at $t_0$ TG_IN is taken to the high value of VHIGH. At $t_1$, EN is asserted and EN_DIS de-asserted; that is, under the arrangement used here, EN and EN_DIS are brought down to Vss. This closes off the path to ground through discharge block 110 for node Y. As EN goes to Vss, HPFET 103 is turned on and TG_OUT begins to rise; and as the gate of NFETD 101 is also connected to node Y, this further increases the current I1. This effectively reduces the impedance between nodes X and Y and allows a current path, I1, to charge TG_OUT=TG_IN=VHIGH, resulting in Vin=Vout through the pass gate 121.

Figure 3:
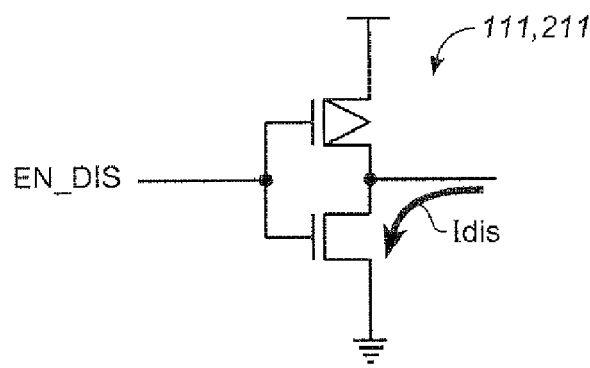
FIG. 3 is a detail of FIGS. 1 and 4.

In the exemplary embodiments, the discharge block 110 (and similarly 210 of FIG. 4, discussed below) includes an inverter 111 connected to receive EN_DIS as an input and with its output connected to the output node. A simple example of an inverter circuit is shown FIG. 3. As illustrated in FIG. 3, the lower transistor will provide the path to ground (or, more generally, Vss) for the current Idis when this transistor is turned on by EN_DIS being high. To protect the inverter 111 from the high voltage values that may be on node Y, one or more transistors can be placed between the output of the inverter 111 and node Y. In the exemplary embodiment, a pair of transistors 113 and 115, each with their gate connected to EN_DIS, are used to protect the inverter 111 from VHIGH when the level shifter is enabled (and EN_DIS is low). When disabled and EN_DIS is asserted (at Vdd here), the transistors will pass the discharge current Idis to the inverter 111 and on to ground/Vss.

Returning to FIGS. 1 and 2 and considering the disabling of the level shifter, this is begun at time $t_2$ where EN_DIS is enabled (taken to Vdd in the example) to discharge TG_OUT to Vss in order to lower VTD to the threshold voltage of NFETD 101. To discharge the node Y and turn off pass gate 121, the current Idis being discharge through block 110 will include I2, from the gate of NFETD 101, the current I3 from the pass gate 121, and any residual current I1 still flowing into the level shifter from node X. At the same time EN_DIS is raised, EN is raised to a voltage, VA, which is about the same as VTD to completely shut off the path. (As discussed above, VA may need to differ Vdd to effect this, as in this case where it is somewhat higher than Vdd.) In other words, to disable the level shifter, it is something like resistive divider circuit used to bring down the gate of NFETD 101 (by discharging the node Y) and to raise the voltage on the gate of HPFET 103 to VTD is to increase the effective impedance on the path between nodes X and Y to reduce the on level of the current I1. The supply voltage (TG_IN) of the level shifter will effect the duration of switching time and amplitude of shoot-through current (the I1 contribution to the Idis current) lost during discharging phase between $t_2$ and $t_3$. Eventually, at $t_3$, the level of TG_OUT is down to Vss, the level shifter is disabled, and the supply level TG_IN is taken back down to Vdd. (Circuitry similar to that of FIG. 1 is discussed in U.S. Pat. No. 6,696,880, which also provides further discussion relevant to its operation and details on variations that can incorporated into the circuits of both FIG. 1 and FIG. 4, including techniques for more quickly enabling the level shifter.)

Figure 4:
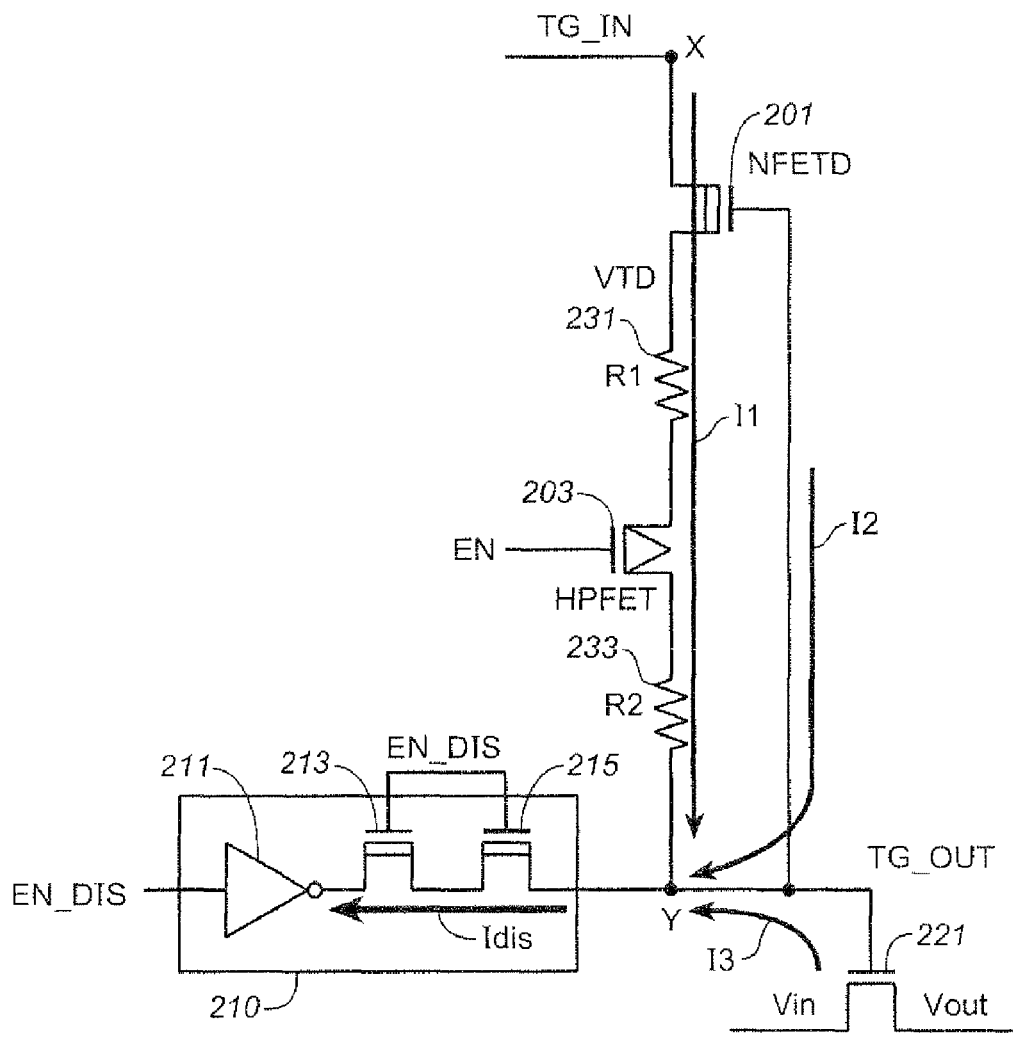
FIG. 4 is an exemplary embodiment of a level shifter employing aspects described herein.

In the operation of a level shifter, it is desirable that in addition to transitioning quickly from the disabled to enabled state, that the circuit can also quickly transition back to the disabled state. How quickly the level shifter is disabled (the time from $t_2$ to $t_3$) is something of a contest to see how quickly the device NFETD 101 can be turned off, with the current Idis trying to sink the currents I2 and I3, while current I1 continues to try to charge up the node Y. In a principle aspect presented here, one or more resistances are added to the level shifter circuit of FIG. 1 to isolate the charging path (I1) from paths I2 and I3 during discharge. An embodiment is illustrated in FIG. 4, where the resistors R1 231, R2 233, or both (used in any combination) are added. The value of these resistances can vary with the design, but could be something in the range of 10-100 kΩ, for example, in a typical application. With the added resistance, there is little impact on the level shifter's turn on speed since the capacitance of pass gate 221 is small. (For instance, is one typical implementation the capacitance at the TG_OUT node is something like 100 fF, although this will of course vary from design to design.)

Figure 5:
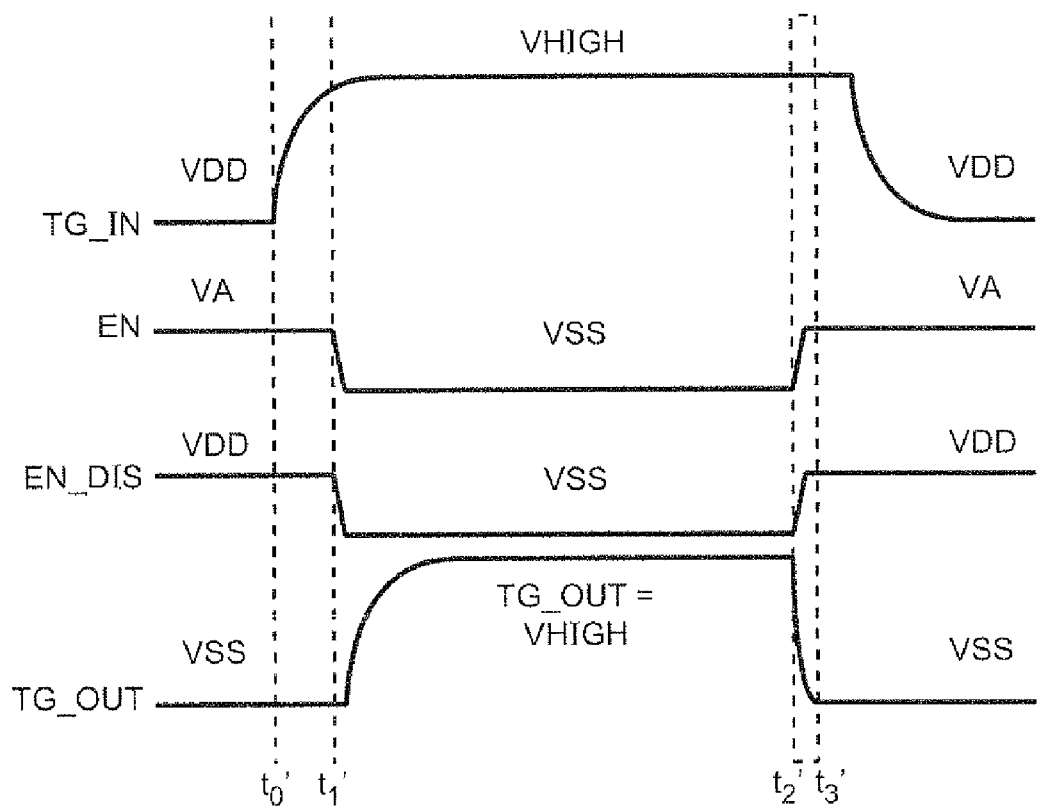
FIG. 5 is a set of waveforms illustrating the operation of the circuit of FIG. 4.

Considering the exemplary embodiment of FIG. 4 further, aside from elements R1 231 and R2 233, the elements can be taken largely the same as in FIG. 1 and are similarly numbered (i.e., 201 for 101, 203 for 103, and so on). FIG. 5 is the equivalent for FIG. 4 of FIG. 2 for the circuit of FIG. 1. As shown in FIG. 5, the waveforms for the inputs of the circuit of FIG. 4 are the same, with TG_IN being taken from Vdd to VHIGH at $t'_0$ and EN and EN_DIS being respectively enabled and disabled at $t'_1$. Due to the presence R1 231, R2 233, or both, the rise time for TG_OUT will be some slower than FIGS. 1 and 2, but as noted, the capacitance involved are typically small, so that the relative RC constant is small, and in the applications under consideration here the small cost in speed for enablement is made up for in the improved discharge behavior.

During discharge, at $t'_2$ EN and EN_DIS are taken to their high values. With the added resistor or resistors, the effective resistive divider allows for a lower dividing point for gate of NFETD, and reducing the on level of the current I1. Consequently, the technique allows a faster turn off for NFETD 201. This allows the time to $t'_3$, when TG_OUT is again at Vss, to come more quickly. In addition to the fast turn off timing of NFETD 203 improving the disable response of the level shifter, and the reduced level of I1 lessens the amount of shoot-through current and power saving is achieved.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A level shifter circuit connected to receive an input voltage at a first node, to receive a first enable signal, and to supply an output voltage at a second node, where the output voltage is provided from the input voltage in response to the first enable signal being asserted and to a low voltage value when the first enable signal is de-asserted, the level shifting circuit comprising:
   a depletion type NMOS transistor, having a gate connected to the second node;
   a PMOS transistor, having a gate connected to the first enable signal;
   a first resistive element distinct from the NMOS and PMOS transistors, where the NMOS transistor, the PMOS transistor and the first resistive elements are connected in series between the first and second nodes, the NMOS transistor being connected to the first node; and
   a discharge circuit connected to the second node and to receive a second enable signal, where the second enable signal is asserted when the first enable signal is de-asserted and is asserted when the first enable signal is de-asserted, and where the discharge circuit comprises one or more series connected transistors having control gates connected to receive the second control signal and connects the second node to the low voltage value when the second enable signal is asserted and isolates the second node from ground when the second enable signal is de-asserted.

2. The level shifter circuit of claim 1, wherein the first resistive element is connected between the PMOS transistor and the second node.

3. The level shifter circuit of claim 2, further comprising a second resistive element distinct from the NMOS and PMOS transistors and connected between the NMOS transistor and the PMOS transistor.

4. The level shifter circuit of claim 1, wherein the first resistive element is connected between the NMOS transistor and the PMOS transistor.

5. The level shifter circuit of claim 1, wherein the discharge circuit comprises:
   an inverter having as input the second enable signal and having an output connected to the second node through the one or more series controlled transistors comprising depletion type NMOS transistors whose gates are connected to the second enable signal.

6. The level shifter circuit of claim 1, wherein the low voltage level is ground.

7. The level shifter circuit of claim 1, wherein the voltage difference between the asserted and de-asserted levels of the first enable signal differs from the voltage difference between the asserted and de-asserted levels of the second enable signal.

8. The level shifter circuit of claim 1, wherein when the first enable signal has the low voltage level when asserted.

9. The level shifter circuit of claim 1, wherein the difference in level between the asserted and de-asserted values of the first enable signal is in the range of 1.8 to 2.2 volts.

10. The level shifter circuit of claim 1, wherein when the second enable signal has the low voltage level when de-asserted.

11. The level shifter circuit of claim 1, wherein the difference in level between the asserted and de-asserted values of the second enable signal is in the range of 2.5 to 2.7 volts.

12. The level shifter circuit of claim 1, wherein the input voltage is in the range of from 10 to 30 volts.

13. The level shifter circuit of claim 12, wherein the PMOS transistor is a high voltage device.

14. A level shifter circuit connected between an input node and an output node, comprising:
   a first current path between the input node and the output node that is connected to receive a first enable signal, the first current path including:
      a depletion type NMOS transistor connected to the input node and having a gate connected to the output node; and
      a PMOS transistor connected in series with the depletion type NMOS transistor between the input and output nodes and having a gate connected to receive the first enable signal, whereby the PMOS transistor is turned on when the first enable signal is asserted; and
   a second current path between the output node and ground that is connected to receive a second enable signal, whereby the output node is connected to ground when the second enable signal is asserted, wherein the level shifter circuit is enabled when the first enable circuit is asserted and the second enable signal is not asserted and the level shifter circuit is disabled when the second enable circuit is asserted and the first enable signal is not asserted, wherein the first current path further includes one or more resistive elements, distinct from the depletion type NMOS and PMOS transistors, connected in series with the PMOS transistor between the depletion type NMOS transistor and the output node, and wherein the second path includes an inverter having an input connected to receive the second enable signal and an output connected to the output node, wherein the inverter is connected to the output node by one or more series connected transistors having control gates connected to receive the second enable signal.

15. The level shifter circuit of claim 14, wherein the PMOS transistor is a high voltage device.

16. The level shifter circuit of claim 14, wherein the one or more resistive elements includes a first resistor connected between the PMOS transistor and the output node.

17. The level shifter circuit of claim 16, wherein the one or more resistive elements further includes a second resistor connected between the depletion type NMOS transistor and the PMOS transistor.

18. The level shifter circuit of claim 14, wherein the one or more resistive elements includes a first resistor connected between the depletion type NMOS transistor and the PMOS transistor.

* * * * *